(12) United States Patent
Pattnayak et al.

(10) Patent No.: US 8,860,497 B1
(45) Date of Patent: Oct. 14, 2014

(54) OXIDE STRESS REDUCTION FOR A CASCODE STACK CIRCUIT

(71) Applicant: Nvidia Corporation, Santa Clara, CA (US)

(72) Inventors: Tapan Pattnayak, Santa Clara, CA (US); Shifeng Yu, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 13/932,890

(22) Filed: Jul. 1, 2013

(51) Int. Cl.
*G05F 1/10* (2006.01)
*H02M 3/04* (2006.01)

(52) U.S. Cl.
CPC ...................... *H02M 3/04* (2013.01)
USPC ............................. 327/534; 327/108; 327/112

(58) Field of Classification Search
CPC .. H03K 17/08; H03K 17/082; H03K 17/0822
USPC .................. 327/108, 109, 110, 111, 112, 534
See application file for complete search history.

(56) References Cited

U.S. PATENT DOCUMENTS

| | | | | |
|---|---|---|---|---|
| 6,693,469 | B2* | 2/2004 | Prodanov | 327/108 |
| 7,746,124 | B2* | 6/2010 | Ajit | 327/108 |
| 7,759,986 | B2* | 7/2010 | Wang et al. | 327/108 |
| 7,868,659 | B2* | 1/2011 | Ker et al. | 326/81 |
| 8,395,433 | B2* | 3/2013 | Rien et al. | 327/313 |

* cited by examiner

*Primary Examiner* — Jeffrey Zweizig

(57) ABSTRACT

A reduced oxide stress cascode stack circuit includes a cascade transistor stack and dynamic bias circuits that supply an output voltage having a magnitude greater than an oxide reliability voltage of their component transistors. The reduced oxide stress cascode stack circuit also includes an offset voltage generator that provides an offset voltage based on a transient extreme of the output voltage, wherein the offset voltage is applied to the cascade transistor stack and the dynamic bias circuits to reduce component transistor voltages commensurate with the oxide reliability voltage. The reduced oxide stress cascode stack circuit further includes a bias voltage supply that modifies a bias voltage value of the cascade transistor stack and dynamic bias circuits by an amount proportional to the offset voltage. A method of reducing oxide stress in a cascode stack circuit is also provided.

20 Claims, 6 Drawing Sheets

OXIDE STRESS REDUCTION FOR A CASCODE STACK CIRCUIT

TECHNICAL FIELD

This application is directed, in general, to an integrated circuit and, more specifically, to a reduced oxide stress cascode stack circuit and a method of reducing oxide stress in a cascode stack circuit.

BACKGROUND

Oxide layers are used in many parts of a semiconductor device such as the dielectric layer in capacitors, the gate oxide between the metal and the semiconductor in MOS transistors and the inter-layer dielectric to isolate conductors from each other, for example. As semiconductor device dimensions are reduced, thickness of the oxide layer is also reduced thereby causing the oxide layer to become more vulnerable to gate-to-source and drain-to-source voltages. If these voltages become too great, oxide breakdown occurs resulting in the destruction of the oxide layer. In extreme cases, this breakdown may take the form of oxide rupture or oxide punch-through causing spurious current flows and heat generation that further lead to failure of the semiconductor device. More subtle degradation of the oxide layer also may occur leading to oxide degradation and failure over time. Circuits designed to provide higher voltage signaling while employing lower voltage devices are particularly sensitive to oxide degradation issues.

SUMMARY

Embodiments of the present disclosure provide a reduced oxide stress cascode stack circuit and a method of reducing oxide stress in a cascode stack circuit.

In one embodiment, the reduced oxide stress cascode stack circuit includes a cascade transistor stack and dynamic bias circuits that supply an output voltage having a magnitude greater than an oxide reliability voltage of their component transistors. The reduced oxide stress cascade stack circuit also includes an offset voltage generator that provides an offset voltage based on a transient extreme of the output voltage, wherein the offset voltage is applied to the cascade transistor stack and the dynamic bias circuits to reduce component transistor voltages commensurate with the oxide reliability voltage. The reduced oxide stress cascade stack circuit further includes a bias voltage supply that modifies a bias voltage value of the cascade transistor stack and dynamic bias circuits by an amount proportional to the offset voltage.

In another aspect, the method of reducing oxide stress in a cascode stack circuit includes providing a cascade transistor stack and dynamic bias circuits that supply an output voltage having a magnitude greater than an oxide reliability voltage of their component transistors. The method of reducing oxide stress in a cascade stack circuit also includes generating an offset voltage based on a transient extreme of the output voltage, wherein the offset voltage is applied to the cascade transistor stack and the dynamic bias circuits to reduce component transistor voltages commensurate with the oxide reliability voltage. The method of reducing oxide stress in a cascode stack circuit further includes modifying a bias voltage value of the cascade transistor stack and dynamic bias circuits by an amount proportional to the offset voltage.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which.

DETAILED DESCRIPTION

Embodiments of the present disclosure reduce transient voltage oxide degradation conditions of component transistors employed in cascode stack circuits, wherein steady-state output voltage signaling exceeds component transistor oxide reliability voltage values. Protection is provided for both transient voltage overshoot and undershoot conditions. In this disclosure, oxide reliability voltage is defined as a voltage that provides an oxide stress corresponding to an oxide remaining adequately functional over a long period of time. Here, embodiments of the present disclosure allow tailoring of this period of time to meet a particular requirement or constraint.

Figure 1:
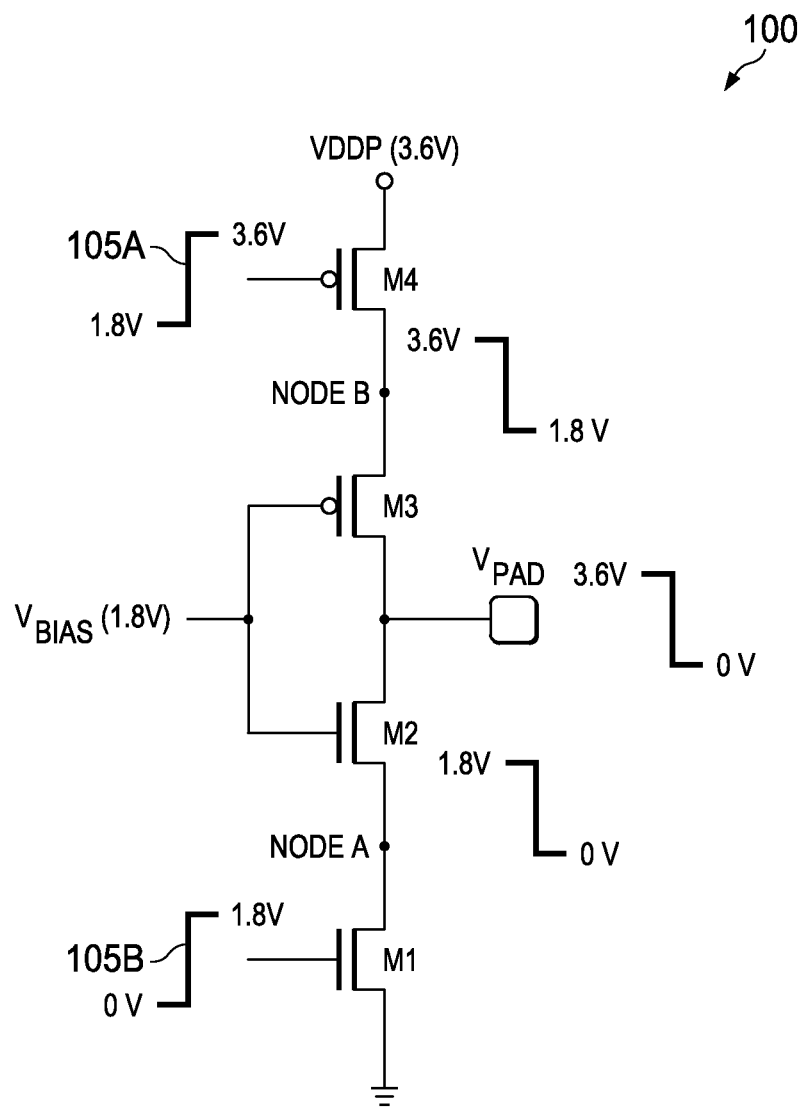
FIG. 1 illustrates a schematic diagram of a cascode transistor stack that provides output signal amplitudes greater than an oxide reliability voltage of its component transistors.

FIG. 1 illustrates a schematic diagram of a cascode transistor stack, generally designated 100, that provides output signal amplitudes greater than an oxide reliability voltage of its component transistors. The cascode transistor stack 100 illustrates a cascode structure and includes a pair of NMOS transistors M1, M2 and a pair of PMOS transistors M3, M4 that are cascode connected between a supply voltage VDDP and ground (a common current return) to provide an output voltage $V_{PAD}$.

A bias voltage $V_{BIAS}$ is applied to the NMOS transistor M2 and the PMOS transistor M3, as shown. The NMOS transistor M2 and the PMOS transistor M3 act as protection transistors. Here, the NMOS transistor M2 keeps a NODE A from having a steady-state voltage value that is greater than the bias voltage $V_{BIAS}$. Correspondingly, the PMOS transistor M3 keeps a NODE B from having a steady-state voltage value that is less than the bias voltage $V_{BIAS}$.

In the illustrated example, each of the component transistors M1, M2, M3 and M4 has an oxide reliability voltage that is slightly greater than 1.8 volts (V). This allows the output voltage $V_{PAD}$ to provide a steady-state voltage swing between 0 V and 3.6 V without incurring oxide reliability voltage stress of the component transistors M1, M2, M3 and M4 for the split rail control signal waveforms 105A, 105B shown. These steady-state amplitudes occur after transient switching amplitudes (e.g., caused by voltage switching or voltage reflections on an output bus) have subsided. However, these transient voltages may temporarily exceed the oxide reliability voltage of one or more of the component transistors M1, M2, M3 and M4, thereby degrading their reliability. The transient voltage condition is further addressed in FIGS. 2A and 2B.

Figure 2A:
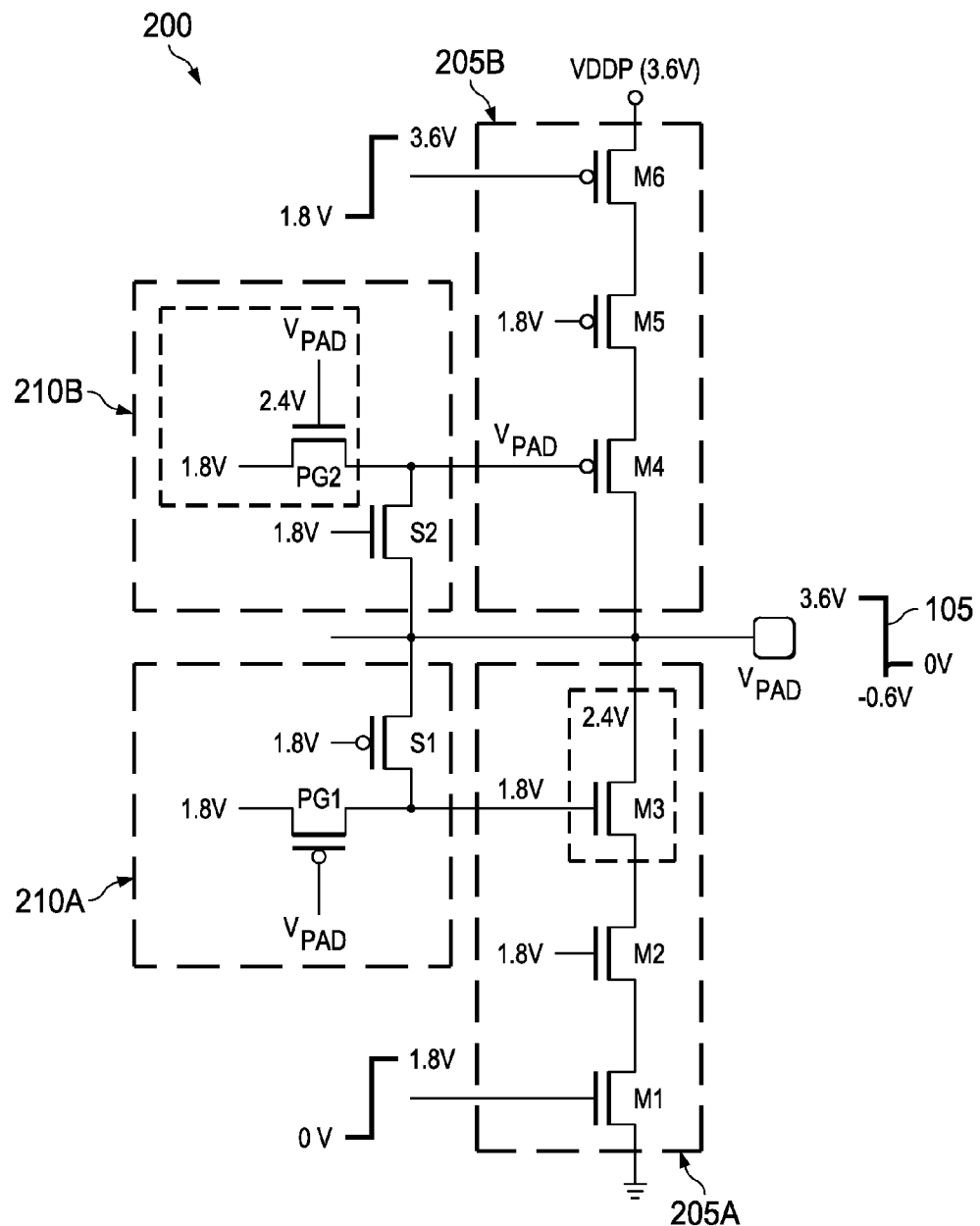
FIGS. 2A and 2B illustrate schematic diagrams showing first and second voltage conditions of a cascode transistor stack circuit having an output voltage swing that is greater than an oxide reliability voltage of its component transistors.
Figure 2B:
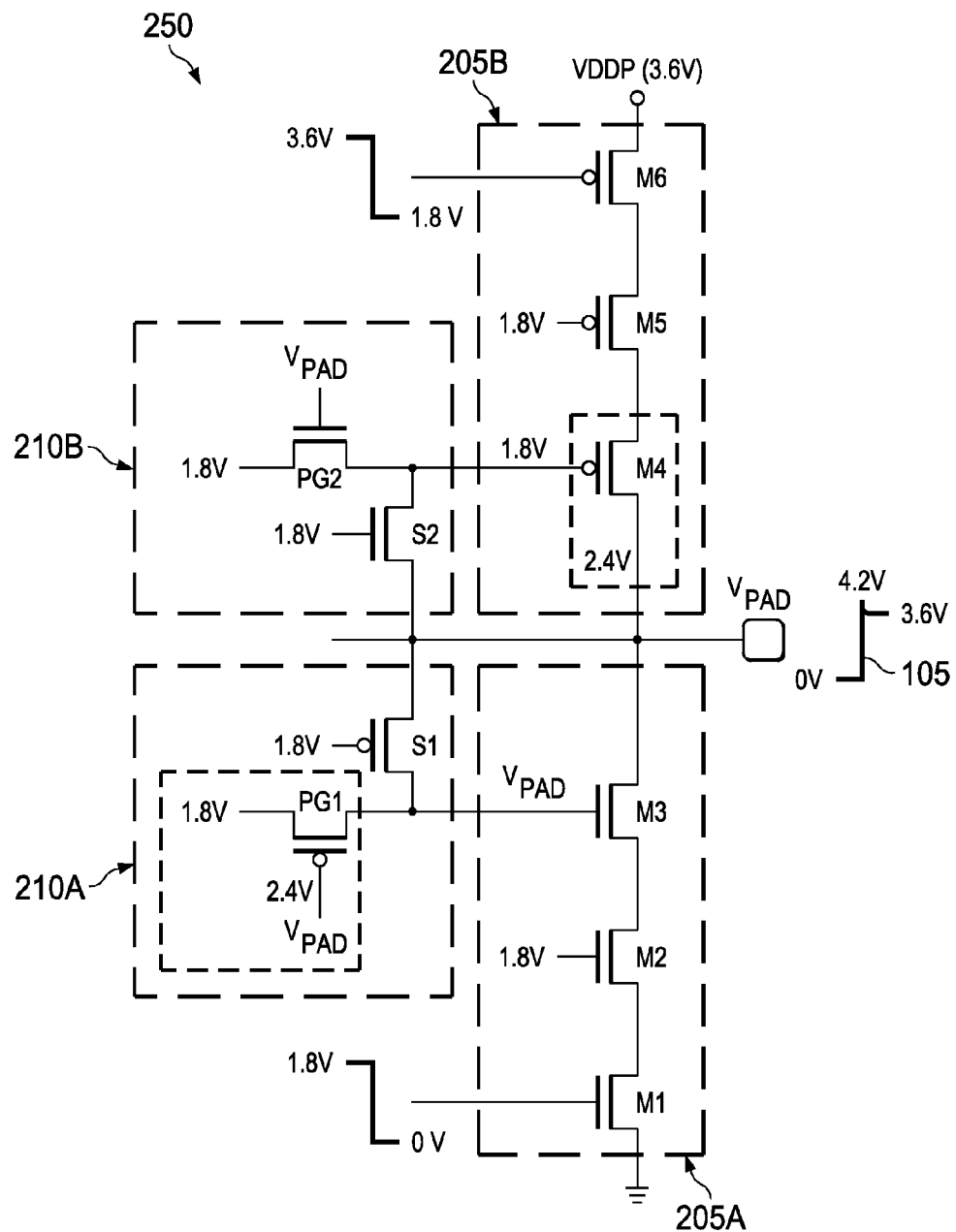

FIGS. 2A and 2B illustrate schematic diagrams showing first and second voltage conditions of a cascode transistor stack circuit, generally designated 200 and 250, having an output voltage ($V_{PAD}$) swing that is greater than an oxide reliability voltage of its component transistors. The cascode transistor stack circuit of FIGS. 2A and 2B includes a cascode of NMOS transistors 205A, having NMOS component transistors M1, M2 and M3, coupled to a first dynamic bias circuit 210A and a cascode of PMOS transistors 205B, having PMOS component transistors M4, M5 and M6, coupled to a second dynamic bias circuit 210B. The first and second dynamic bias circuits 210A, 210B include first and second PMOS transistors S1, PG1 and first and second NMOS transistors S2, PG2, respectively.

In the illustrated example, a steady-state output voltage swing between 0 V and 3.6 V is provided by split rail control signal waveforms having a 1.8 V swing, as shown. The first voltage condition 200 corresponds to an initial output signal amplitude of –0.6 V (i.e., a transient voltage undershoot of 0.6 V). The second voltage condition 250 corresponds to an initial output signal amplitude of 4.2 V (i.e., a transient voltage overshoot of 0.6 V).

In addition to the split rail control signal waveforms providing a 1.8 V swing to the component transistors M1 and M6, a fixed biasing of 1.8 V is applied to a portion of the component transistors, as shown. In the first and second dynamic bias circuits 210A and 210B, component transistors S1, S2 and PG1, PG2 configure their respective cascode stack transistors M3 and M4 as a diode or a pass gate connected cascode, respectively. The output voltage $V_{PAD}$ is employed to control this condition.

As may be seen in FIG. 2A, the cascode stack transistor M3 and the component transistor PG2 will experience a transient oxide layer stress corresponding to 2.4 V due to the output voltage $V_{PAD}$ being at –0.6 V. Similarly, as may be seen in FIG. 2B, the cascode stack transistor M4 and the component transistor PG1 will experience a transient oxide layer stress corresponding to 2.4 V due to the output voltage $V_{PAD}$ being at 4.2 V.

Additionally, the fixed bias voltage of 1.8 V may be generated internally, where it may vary between 1.62 V and 1.98 V due to component tolerances. At a fixed bias voltage of 1.98 V, a transient oxide layer stress corresponding to 2.58 V may be experienced. In the illustrated example, even a transient oxide layer stress corresponding to a transient peak voltage of 2.4 V will degrade lifetimes of the cascode stack transistors M3 and M4 and the component transistors PG1 and PG2.

Figure 3A:
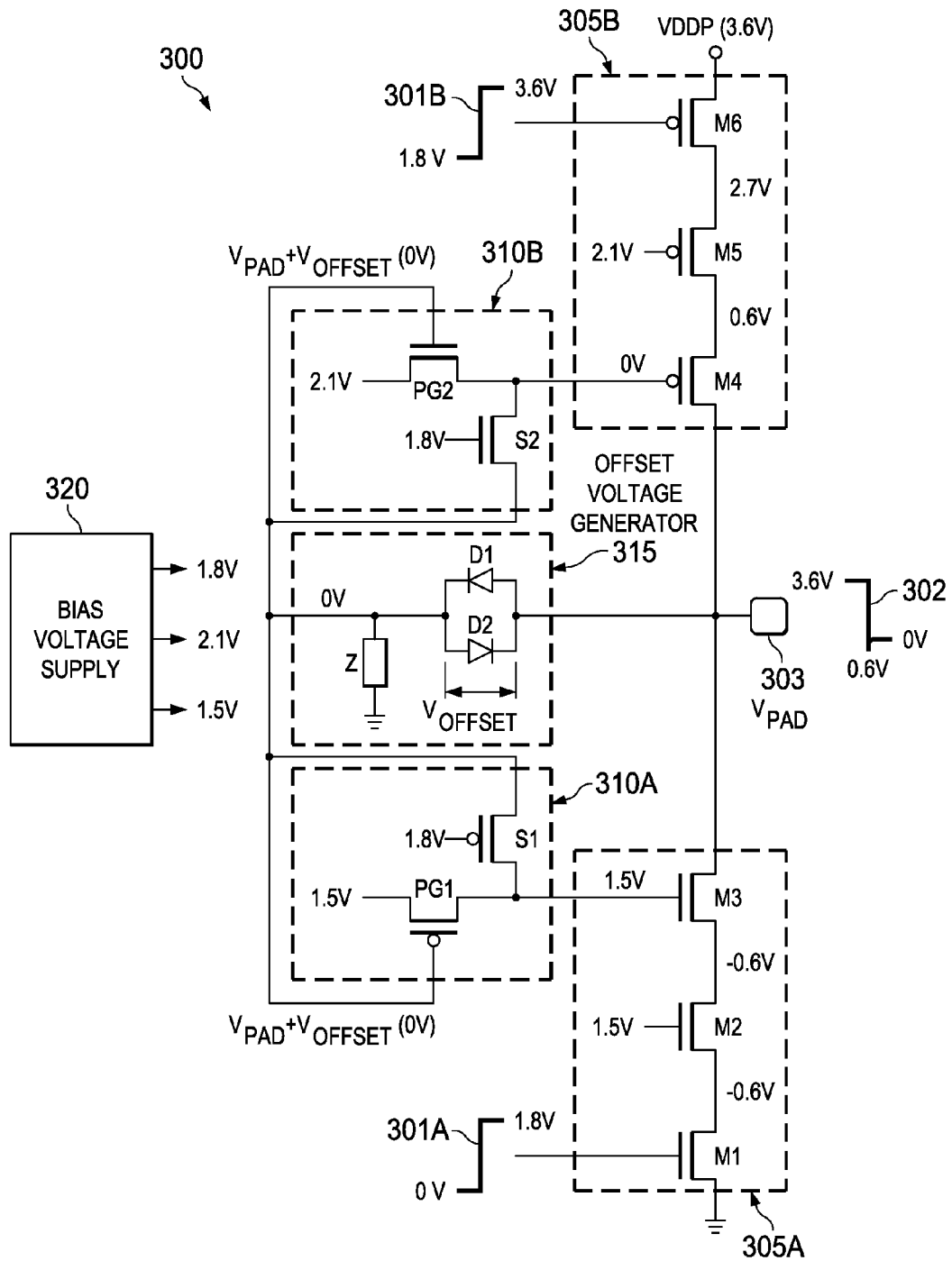
FIGS. 3A and 3B illustrate schematic diagrams showing first and second voltage conditions of an embodiment of a cascode transistor stack circuit constructed according to principles of the present disclosure.
Figure 3B:
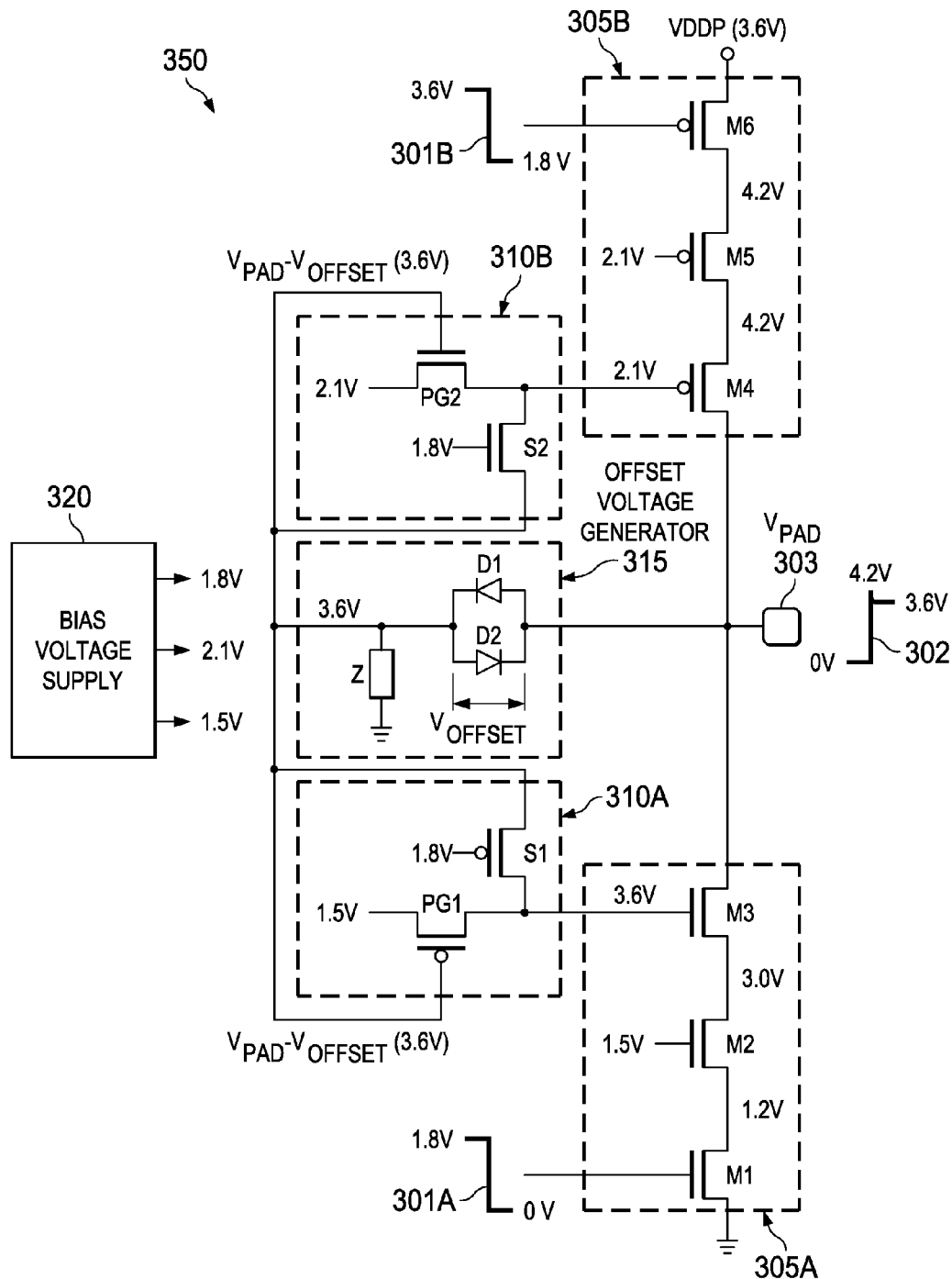

FIGS. 3A and 3B illustrate schematic diagrams showing first and second voltage conditions of an embodiment of a cascode transistor stack circuit, generally designated 300 and 350, constructed according to principles of the present disclosure. In the illustrated embodiment, transient voltage conditions exceeding an oxide reliability voltage of component transistors employed in the cascode transistor stack circuit have been eliminated for overshoot or undershoot transient voltages.

Generally, oxide stress conditions of the illustrated cascode stack (e.g., cascode stack transistors M3 and M4) have been transferred to their respective dynamic bias circuits, which conduct less current. Then, an offset voltage is applied to the dynamic bias circuits to remove these transferred oxide stress conditions. Additionally, bias supply voltages modified by amounts proportional to the offset voltage are employed to ensure that all voltages associated with component transistors do not exceed the oxide reliability voltage. As noted earlier, the oxide reliability voltage is selected to ensure an oxide remaining adequately functional over a long period of time (e.g., a five year period).

The cascode transistor stack circuit of FIGS. 3A and 3B includes a cascode of NMOS transistors 305A, having NMOS component transistors M1, M2 and M3, coupled to a first dynamic bias circuit 310A and a cascode of PMOS transistors 305B, having PMOS component transistors M4, M5 and M6, coupled to a second dynamic bias circuit 310B. The first and second dynamic bias circuits 310A, 310B include first and second PMOS transistors S1, PG1 and first and second NMOS transistors S2, PG2, respectively.

The cascode transistor stack circuit of FIGS. 3A and 3B also includes an offset voltage generator 315 and a bias voltage generator 320. In the illustrated embodiment, the offset voltage generator 315 includes a pair of opposing parallel connected diodes D1, D2 and an impedance Z. The offset voltage generator 315 provides an offset voltage $V_{OFFSET}$ having a magnitude of 0.6 V (corresponding to a conducting diode voltage). In other embodiments, the magnitude of the offset voltage $V_{OFFSET}$ may be adjusted to accommodate different transient overshoot or undershoot values of the output voltage $V_{PAD}$. The bias voltage supply 320 provides bias voltages of 1.5 V, 1.8 V and 2.1 V, in the illustrated embodiment.

A steady-state output voltage swing 302 between 0 V and 3.6 V is provided by split rail control signal waveforms 301A, 301B having a 1.8 V swing, as shown. The first voltage condition 300 corresponds to an initial output signal amplitude of –0.6 V (i.e., a transient voltage undershoot of 0.6 V). The second voltage condition 350 corresponds to an initial output signal amplitude of 4.2 V (i.e., a transient voltage overshoot of 0.6 V).

The illustrated embodiment provides for removal of all transient oxide layer stress conditions that exceed the oxide reliability voltage through an appropriate use of the bias voltages 1.5 V and 2.1 V from the bias voltage supply 320 and an offset adjusted output voltage provided by the offset voltage generator 315. The offset voltage generator 315 provides an offset adjusted output voltage to each of the first and second dynamic bias circuits 310A, 310B. For a transient undershoot condition (FIG. 3A), the offset adjusted output voltage has an initial transient undershoot value that is equal to an initial output voltage $V_{PAD}$ (–0.6 V) plus the offset voltage $V_{OFFSET}$ (0.6 V), which equals zero volts (0 V). This initial transient undershoot value increases to 0.6 V as the transient undershoot condition subsides. Correspondingly, for a transient overshoot condition (FIG. 3B), the offset adjusted output voltage has an initial transient overshoot value that is equal to an initial output voltage $V_{PAD}$ (4.2 V) minus the offset voltage $V_{OFFSET}$ (0.6 V), which equals 3.6 V. This initial transient overshoot value decreases to 3 V as the transient overshoot condition subsides.

Figure 4:
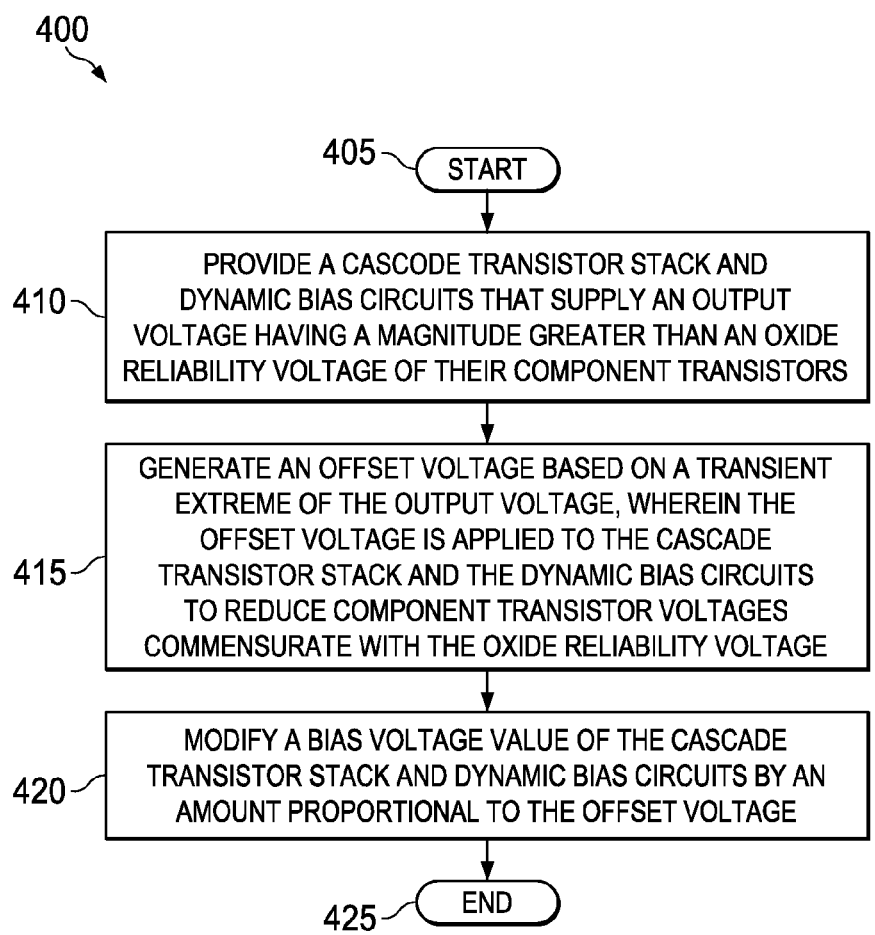
FIG. 4 illustrates a flow diagram of an embodiment of a method of reducing oxide stress in a cascode stack circuit carried out according to the principles of the present disclosure.

FIG. 4 illustrates a flow diagram of an embodiment of a method of reducing oxide stress in a cascode stack circuit, generally designated 400, carried out according to the principles of the present disclosure. The method 400 starts in a step 405 and a cascode transistor stack and dynamic bias circuits are provided that supply an output voltage having a magnitude greater than an oxide reliability voltage of their component transistors, in a step 410. Then, an offset voltage is generated based on a transient extreme of the output voltage, wherein the offset voltage is applied to the cascode transistor stack and the dynamic bias circuits to reduce component transistor voltages commensurate with the oxide reliability voltage, in a step 415. A bias voltage value of the cascade transistor stack and dynamic bias circuits is modified by an amount proportional to the offset voltage, in a step 420.

In one embodiment, an oxide voltage stress on a component transistor of the cascade transistor stack is transferred to a dynamic bias circuit component transistor. Correspondingly, the dynamic bias circuit component transistor operates as a pass gate transistor for the component transistor of the cascade transistor stack. In another embodiment, the offset voltage is applied to the dynamic bias circuits to reduce oxide voltage stress on at least one dynamic bias circuit component transistor.

In yet another embodiment, a value of the offset voltage is determined by a peak excursion of a voltage transient from a steady-state value of the output voltage.

Correspondingly, a pair of opposing parallel connected diodes is employed in generating the offset voltage. In still another embodiment, a difference in the output voltage and the offset voltage is applied to control conduction of a pass gate component transistor of the dynamic bias circuits. In a further embodiment, a difference in the output voltage and the offset voltage is applied to control conduction of a diode-forming component transistor of the dynamic bias circuits. In a yet further embodiment, modifying the bias voltage value includes increasing or decreasing the bias voltage value by half of the offset voltage. The method 400 ends in a step 425.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which this application relates will appreciate that other and further additions, deletions, substitutions and modifications may be made to the described embodiments.

What is claimed is:

1. A reduced oxide stress cascode stack circuit, comprising:
    a cascade transistor stack and dynamic bias circuits that supply an output voltage having a magnitude greater than an oxide reliability voltage of their component transistors;
    an offset voltage generator that provides an offset voltage based on a transient extreme of the output voltage; and
    a bias voltage supply that modifies a bias voltage value of the cascade transistor stack and the dynamic bias circuits, wherein the offset voltage is applied to the cascade transistor stack and the dynamic bias circuits to reduce component transistor voltages commensurate with the oxide reliability voltage.

2. The reduced oxide stress cascode stack circuit as recited in claim 1 wherein an oxide voltage stress on a component transistor of the cascade transistor stack is transferred to a dynamic bias circuit component transistor.

3. The reduced oxide stress cascode stack circuit as recited in claim 2 wherein the dynamic bias circuit component transistor operates as a pass gate transistor for the component transistor of the cascade transistor stack.

4. The reduced oxide stress cascode stack circuit as recited in claim 1 wherein the offset voltage is applied to the dynamic bias circuits to reduce oxide voltage stress on at least one dynamic bias circuit component transistor.

5. The reduced oxide stress cascode stack circuit as recited in claim 1 wherein a value of the offset voltage is determined by a peak excursion of a voltage transient from a steady-state value of the output voltage.

6. The reduced oxide stress cascode stack circuit as recited in claim 1 wherein a pair of opposing parallel connected diodes is employed in generating the offset voltage.

7. The reduced oxide stress cascode stack circuit as recited in claim 1 wherein a difference in the output voltage and the offset voltage is applied to control conduction of a pass gate component transistor of the dynamic bias circuits.

8. The reduced oxide stress cascode stack circuit as recited in claim 1 wherein a difference in the output voltage and the offset voltage is applied to control conduction of a diode-forming component transistor of the dynamic bias circuits.

9. The reduced oxide stress cascode stack circuit as recited in claim 1 wherein the bias voltage supply modifies the bias voltage value of the cascade transistor stack-and dynamic bias circuits by an amount proportional to the offset voltage.

10. The reduced oxide stress cascode stack circuit as recited in claim 9 wherein modifying the bias voltage value includes increasing or decreasing the bias voltage value by half of the offset voltage.

11. A method of reducing oxide stress in a cascade stack circuit, comprising:
    providing a cascade transistor stack and dynamic bias circuits that supply an output voltage having a magnitude greater than an oxide reliability voltage of their component transistors;
    generating an offset voltage based on a transient extreme of the output voltage; and
    modifying a bias voltage value of the cascade transistor stack and the dynamic bias circuits, wherein the offset voltage is applied to the cascade transistor stack and the dynamic bias circuits to reduce component transistor voltages commensurate with the oxide reliability voltage.

12. The method as recited in claim 11 wherein an oxide voltage stress on a component transistor of the cascade transistor stack is transferred to a dynamic bias circuit component transistor.

13. The method as recited in claim 12 wherein the dynamic bias circuit component transistor operates as a pass gate transistor for the component transistor of the cascade transistor stack.

14. The method as recited in claim 11 wherein the offset voltage is applied to the dynamic bias circuits to reduce oxide voltage stress on at least one dynamic bias circuit component transistor.

15. The method as recited in claim 11 wherein a value of the offset voltage is determined by a peak excursion of a voltage transient from a steady-state value of the output voltage.

16. The method as recited in claim 11 wherein a pair of opposing parallel connected diodes is employed in generating the offset voltage.

17. The method as recited in claim 11 wherein a difference in the output voltage and the offset voltage is applied to control conduction of a pass gate component transistor of the dynamic bias circuits.

18. The method as recited in claim 11 wherein a difference in the output voltage and the offset voltage is applied to control conduction of a diode-forming component transistor of the dynamic bias circuits.

19. The method as recited in claim 11, wherein said modifying includes modifying the bias voltage value of the cascade transistor stack and dynamic bias circuits by an amount proportional to the offset voltage.

20. The method as recited in claim 19 wherein modifying the bias voltage value includes increasing or decreasing the bias voltage value by half of the offset voltage.

* * * * *